April 16, 1963 L. B. M. BUCHANAN 3,086,067

THERMOPILE APPARATUS

Filed April 4, 1960 2 Sheets-Sheet 1

INVENTOR
LESLIE B. M. BUCHANAN
BY William J. Foley
ATTORNEY

THERMOPILE APPARATUS

Filed April 4, 1960

2 Sheets-Sheet 2

INVENTOR
LESLIE B.M.BUCHANAN

BY William J. Foley
ATTORNEY

United States Patent Office 3,086,067
Patented Apr. 16, 1963

3,086,067

THERMOPILE APPARATUS

Leslie B. M. Buchanan, Galloway, Ohio, assignor to Westinghouse Electric Corporation, East Pittsburgh, Pa., a corporation of Pennsylvania Filed Apr. 4, 1960, Ser. No. 19,878
5 Claims. (Cl. 136—4)

This invention relates to thermopile apparatus for heat pumping and electrical power generation purposes.

Thermopiles of the type to which this invention relates are thermoelectric devices utilizing in one form the Peltier principle of heat absorption and heat dissipation at current carrying junctions between materials having dissimilar thermoelectric properties. Other forms of such apparatus, namely those which generate electrical current, utilize a reverse effect, known as the Seebeck effect, in which an electric current is induced in a thermoelectric body whose junctions with other dissimilar bodies are maintained at different temperatures.

Both the Peltier effect and the Seebeck effect have been known for many years. Their utilization in commercially successful devices has been delayed by the lack of truly efficient thermoelectric materials as well as by the lack of efficient, yet inexpensive, structures for the thermopiles themselves. The present invention is directed principally to the solution of certain of the problems associated with the thermopile structure, rather than to the thermoeletcric materials themselves.

The low voltage characteristics of presently known thermoelectric materials dictate that thermopiles utilizing these materials employ relatively large numbers of thermoelectric bodies and conducting members for forming electrical and thermal junctions with these bodies. Conveying heat to and away from the numerous thermoelectric junctions in a thermopile poses serious problems of structural and thermal design for such apparatus.

This invention enables the thermopile to be constructed with a minimum number of parts, or components, and assembled in an economical manner so as to assure both reliable and efficient operation of the thermopile.

It is a basic concept of the invention to employ a plurality of metallic conducting members which form electrical junctions between the thermoelectric bodies and which also are provided with fins, or fin regions, having relatively large surface areas by which heat is absorbed from or transferred to certain mediums and to and from the thermoelectric junctions. In accordance with the invention these conducting members are arranged in two sets, with the conducting members of each set arranged substantially parallel to all the other conducting members. The conducting members of one set have their fins in spaced relationship with the fins of the other set of conducting members and both sets are provided with tongues which project toward the other set and interdigitate at their ends. These tongues of the several conducting members have substantially smaller surface areas than the fins with which they are associated and the incremental surface area decreases from the fins to the overlapping regions of the tongues so as to minimize heat transfer between the tongues of one set of conducting members and the tongues of the other set of conducting members. Interposed between the tongues of the several conducting members is a series of bodies alternately formed of two materials having different thermoelectric properties. Each of these bodies is attached to adjacent pairs of tongues of the two sets of conducting members, so that the thermoelectric bodies and the conductor tongues are connected in series electrical circuit.

The thermopile structure of the invention is made rigid and structurally strong by means of a unique clamping arrangement whereby the several fins of each set of conducting members are mechanically interconnected and then the two sets of conducting members are mechanically interconnected through certain of the conducting members of each set. The connections are such as to minimize the transfer of heat between the conducting members other than through the thermoelectric bodies.

The invention further contemplates novel and unique configurations for the tongues of the conducting members, which offer the advantages of simplified thermopile assembly and also function to minimize the likelihood of damage to the thermoelectric bodies as a result of structural loads applied to the conducting members.

Further objects of the inventions, as well as additional features and advantages thereof will be apparent from the following detailed description of the invention wherein reference is made to the accompanying drawings, forming a part hereof, and wherein.

Figure 1:
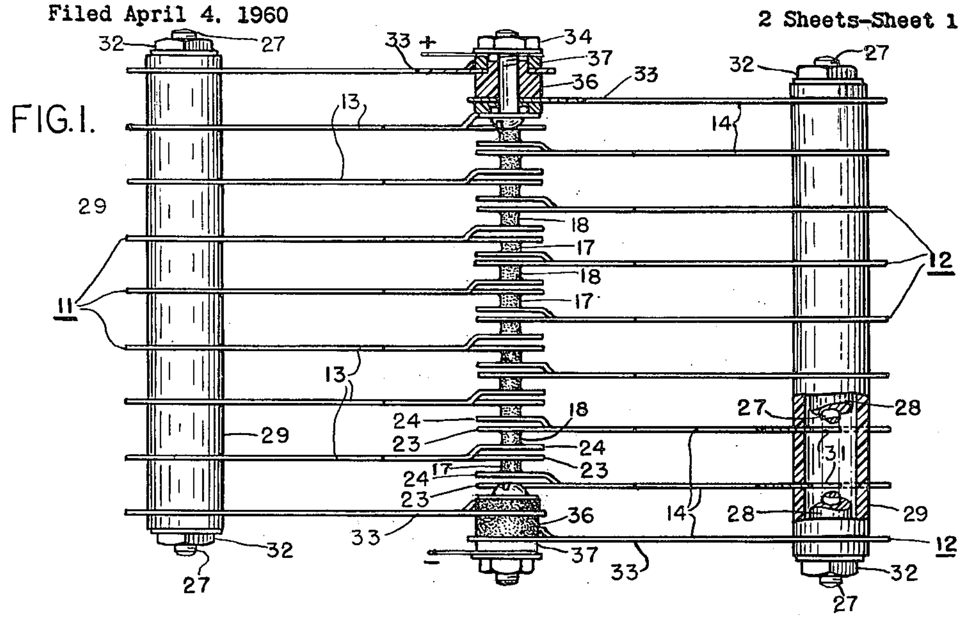
FIG. 1 is a plan view of a thermopile assembly embodying the invention.
Figure 2:
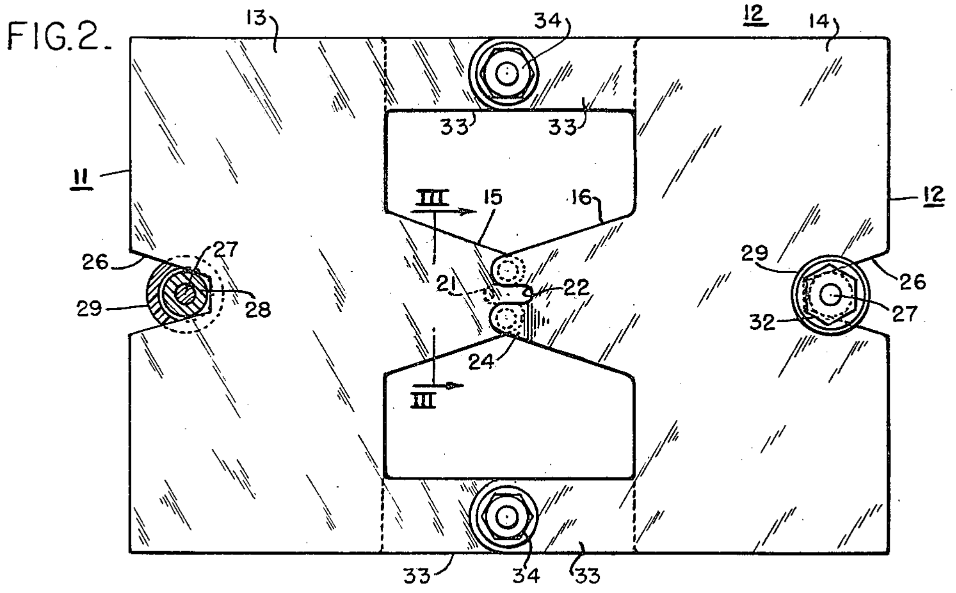
FIG. 2 is an end view of the thermopile.

As is best shown in FIG. 1, the thermopile includes two sets of conducting members 11 and 12 formed of sheet copper, aluminum, or other good heat conducting material. Conducting members 11, forming the left-hand set in FIGS. 1 and 2, are shaped to provide upright fins 13 having large surface areas to provide extended heat transfer surfaces with air, or other fluid medium, in contact therewith. Conducting members 12, making up the right-hand set in FIGS. 1 and 2, are likewise shaped to provide fins 14. Conducting members 11 are further shaped to provide tongues, or projecting portions, 15 which extend toward and interdigitate with similarly shaped tongues 16 on conducting members 12.

As can be seen in FIG. 1, conducting members 11 on the left are preferably staggered or offset with respect to conducting members 12 on the right to simplify the overlapping or interdigitating of the end portions of their respective tongues 15 and 16. These tongues 15 and 16 are of substantially smaller surface areas than the fins 13 and 14 with which they are associated and preferably taper in height, as shown in FIG. 2, from their junction with their fins to the overlapping end regions thereof. This small surface area and tapered configuration of the tongues, 15 and 16, is intended to minimize the transfer of heat, between the conducting members 11 and 12.

Disposed between the tongues 15 and 16 in the overlapping regions thereof is a series of thermoelectric bodies 17 and 18. These bodies are alternately formed of two materials having dissimilar thermoelectric properties. Bodies 17 may, for example, be formed of a material such as antimony or a similar material having positive thermoelectric properties and bodies 18 may be formed by bismuth or a similar material having negative thermoelectric properties. For convenience in manufacture all of the bodies 17 and 18 may have the same configuration and dimensions and, as shown, are preferably formed as short cylindrical plugs, or pellets. The ends of the individual bodies 17 and 18 are soldered, or otherwise thermally and electrically connected, to tongues 15 and 16 of adjacent pairs of conducting members 11 and 12 whereby heat dissipating and heat absorbing junctions are formed between the bodies and the conducting members.

Figure 3:
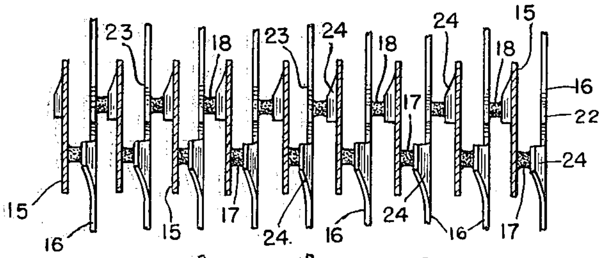
FIG. 3 is a fragmentary sectional view of the junction region of the thermopile, which view is taken generally as indicated by the line III—III in FIG. 2.

In the preferred form of conducting members 11 and 12 shown in FIGS. 1, 2 and 3 the tongues 15 and 16 of these members are bifurcated by slots 21 and 22 in the overlapping regions thereof to provide two junction projections 23 and 24 on each tongue. One of the junction projections, 24, on each of the tongues, 15 and 16, is displaced, or offset, from the plane of the remainder of the conducting member, 13 or 14. It will be noted that this offset junction projection 24 is uppermost for conducting members 11 and lowermost for conducting members 12. Actually, conducting members 11 and conducting members 12 are identical and either one will serve as the other simply by rotating it 180 degrees in a vertical plane about the overlapping region of its tongue which provides junction projections 23 and 24.

The thermoelectric bodies 17 and 18 are preferably arranged in two parallel rows, as shown in FIG. 3, so that their ends are aligned with the junction projections 23 and 24. It will be noted that a thermoelectric body connected to the offset junction projection 24 of one of the heat conducting members, say 11, has its other end connected to the non-offset junction projection 23 of the next conducting member in the series (12). With this construction, the thermoelectric bodies 17 and 18 can be made shorter in length than the actual spacing between adjoining tongues 15 and 16 of the two sets of conducting members, thereby conserving thermoelectric material and, particularly, allowing some latitude of design with respect to the length of the thermoelectric bodies and the spacing of the conducting members 11 and 12.

This offsetting of the junction projections 23 and 24 with respect to each other also affords a degree of flexibility lengthwise of the array of thermoelectric bodies 17 and 18 and the junction projections so as to allow for inaccuracies in the spacing of the conducting members 11 and 12 of the two sets.

Figure 4:
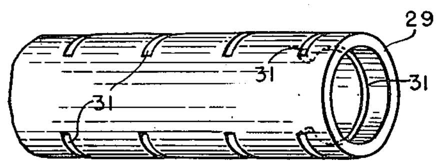
FIG. 4 is an enlarged, fragmentary perspective view of a spacer unit employed in structurally connecting the conducting members of the thermopile.

The means by which the conducting members 11 and 12 of the two sets are structurally connected together and the means whereby one set is structurally connected to the other set, so as to make the entire assembly rigid and strong, are shown in FIGS. 1, 2 and 4. In accordance with the invention, the outer, or end, edges of conducting members 11 and 12 are provided with identical V-shaped slots 26. Disposed within each of the slots 26 and extending through the several conducting members, 11 or 12, of each set is a tie rod 27 having a sleeve 28 of electrical insulating material thereon which prevents the tie rod 27 from shorting two or more conductor members. It is important to note that electrical current is required to flow through only the end portions of the tongues 15 and 16 of the conducting members. The remaining portions of the conducting members are employed principally to conduct heat to and away from the thermoelectric bodies. The fins 13 and 14 of the conducting members, are nevertheless, at substantially the same electrical potential as their tongues 15 and 16, so that it is necessary to prevent the fins from contacting one another or from being shorted by an electrical conductor.

Surrounding the insulating sleeve 28 and supported thereby is a spacer device 29 in the form of a cylindrical tube formed of electrical insulating material. Spacer device 29 is cut or slotted as indicated at 31 in spaced regions and the spacing corresponds to the spacing between the conducting members, 11 or 12, in one or the other of the sets of conducting members. With the slotted spacer device 29 disposed in the notches 26 of one set of conducting members, say 12, tightening two nuts 32 threadably carried by the ends of the tie rod 27 results in lengthwise compression of spacer device 29 and clamping of the several heat conducting members in the slots 31 therein. Each set of conducting members 11 and 12 is mechanically connected in this manner.

It is also desirable to mechanically connect conducting members 11 of one set to conducting members 12 of the other set so as to relieve the thermoelectric bodies 17 and 18 from the stresses which would result from relative movement of the two sets of conducting members. This is preferably accomplished by providing tie arms 33 at the upper and lower portions of each of the endmost conducting members 11 and 12. These tie bars extend from the fins 13 and 14 toward the opposite fins and are clamped together by means of bolts 34 which pass through overlapping regions thereof. Each pair of tie arms 33 thus connected are preferably insulated from one another both thermally and electrically by means of a spacer, or washer, 36 formed of insulating material. Two of the bolts 34 at opposite ends of the thermopile may, if desired, be employed as terminals to which electrical conductors are connected and the bolts so functioning may be provided with a conducting washer 37 beneath the head thereof for forming an electrical connection with the tie arms 33 on the endmost conducting members.

Figure 5:
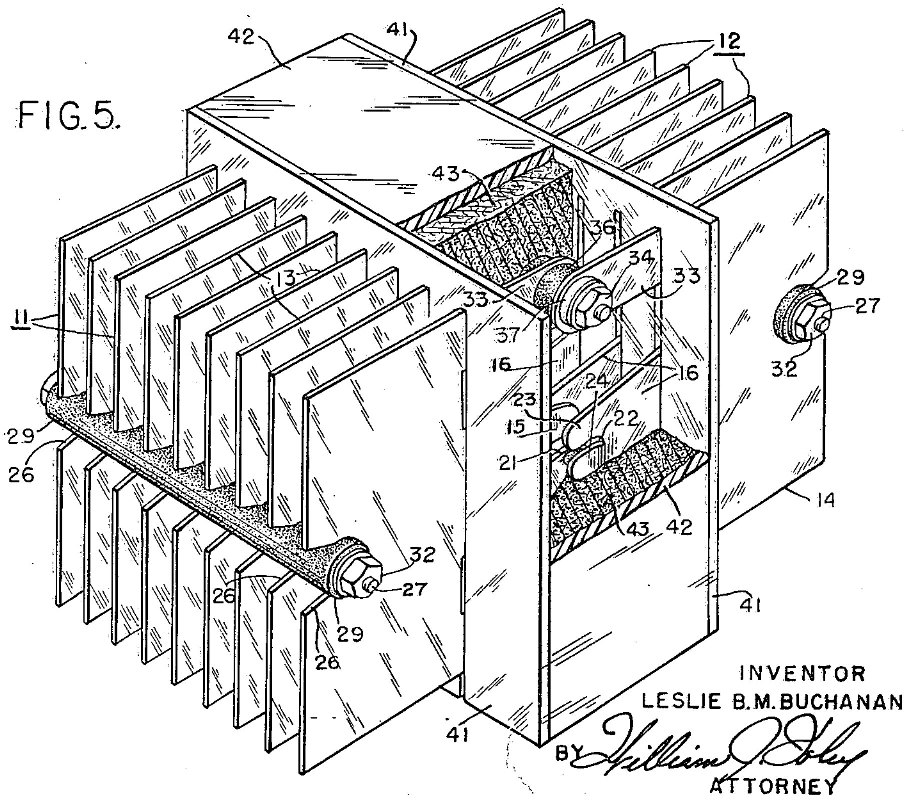
FIG. 5 is a perspective view of a complete thermopile in which portions of the structure are broken away to illustrate other components.

In FIG. 5 is illustrated a completed thermopile utilizing this invention and wherein the junction region of the thermopile is encased in a protective and thermal insulating body. Structurally, encasement of the junction region of the thermopile is effected by inserting comb-slotted sheets of insulation board 41 over each set of conducting members, 11 and 12, in the region of the inner edges of their fins, 13 and 14. The space between the peripheral edges of boards 41 is closed by a wrapper strip 42 of rigid heat insulating material. The entire region, or space, enclosed by sheets 41 and wrapper strip 42 is then filled with a foamable insulation 43, of a type such as polyurethane, which can be poured into the space in a condensed state, thereafter to be expanded or foamed, to surround and encase all surfaces of the heat conducting tongues, 15 and 16, as well as the thermoelectric bodies 17 and 18. The foam insulation 43 reduces the transmission of heat from one set of conducting members, 13 or 14, to the other set of conducting members and, additionally, adheres to and provides structural support for the thermoelectric bodies and the heat conducting members.

Figure 6:
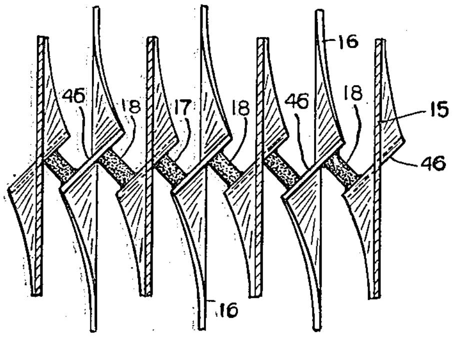
FIG. 6 is an enlarged sectional view similar to FIG. 3, but illustrating a modified junction structure for the thermopile.

FIG. 6 illustrates a modification of the junction region of the heat conducting members 11 and 12. Instead of employing a bifurcated tongue, 15 or 16, with one junction projection offset from the other, the overlapping region 46 of each tongue 15 and 16 can be twisted so that it is disposed obliquely of the plane of its heat conducting member. This twisting of the junction region 46 disposes a portion of the tongues, 15 or 16, closer to a similar region of the next conducting number in the series, thereby enabling shorter thermoelectric bodies, 17 and 18, to be employed. This junction region configuration possesses a further advantage in that stresses on the thermoelectric bodies, such as might be imposed when a conducting member 11 or 12 is twisted on its tie rod 27, are transmitted somewhat axially through the thermoelectric body rather than transversely thereof and subject the body to a combination of compression and shear forces rather than purely shear forces. Since such bodies are generally stronger in compression than in shear, the likelihood of their being damaged by forces tending to shift the conducting members is minimized.

While the invention has been shown in several forms, it will be obvious to those skilled in the art that it is not so limited, but is susceptible of various other changes and modifications without departing from the spirit thereof.

What is claimed is:

1. In a thermopile, first and second sets of metallic heat conducting members, said members each having an upright sheet-like fin providing an extended heat transfer surface, the fins of the members in each set being arranged in spaced, parallel and aligned relationship, the fins of one set of members being parallel to but laterally spaced from the fins of the other set of members, the members of each set having tongues projecting from their fins toward and interdigitating with the tongues of the other set of members, said tongues having substantially less surface area than said fins, a series of bodies alternately formed of two materials having dissimilar thermoelectric properties, said series of bodies being disposed between said tongues in the overlapping regions of the tongues with one body electrically and thermally connected to each adjoining pair of tongues from the two sets of members, and means for connecting the fins of at least one of said sets of members to each other comprising a tubular spacer device formed of electrical insulating material, said spacer having a plurality of slots disposed in spaced relation with each other and disposed in planes transverse to the axis of said spacer, the fins of said one set of members being received therein, and a staybolt extending axially through said spacer and clamping said fins to said spacer.

2. In a thermopile, first and second sets of metallic heat conducting members, said members each having an upright sheet-like fin providing an extended heat transfer surface, the fins of the members in each set being arranged in spaced, parallel and aligned relationship, the fins of one set of members being parallel to but laterally spaced from the fins of the other set of members, the members of each set having tongues projecting from their fins toward and interdigitating with the tongues of the other set of members, said tongues having substantially less surface area than said fins, a series of bodies formed of two materials having dissimilar thermoelectric properties, there being one of said bodies disposed between and electrically and thermally connected to each adjoining pair of tongues from the two sets of members, means electrically insulated from said members and mechanically connecting the several fins of each set of members, means mechanically connecting at least the endmost fins of one set to the endmost fins of the other set, and means for connecting the fins of at least one of said sets of members to each other comprising a tubular spacer device formed of electrical insulating material, said spacer having a plurality of slots disposed in spaced relation with each other and disposed in planes transverse to the axis of said spacer, the fins of said one set of members being received therein, and a staybolt extending axially through said spacer and clamping said fins to said spacer.

3. In a thermopile, first and second sets of metallic heat conducting members, said members each having a sheet-like fin portion providing an extended heat transfer surface, the fin portions of the members in each set being arranged in spaced parallel and aligned relationship with the fin portions of one set being parallel to but laterally spaced from the fin portions of the other set of members, the members of one set having tongue portions projecting from their fin portions toward and interdigitating with similar tongue portions of the members of the other set, the tongue portions of each of said members having at least a portion thereof offset from the plane of the remaining portion of said member whereby said offset portion is closer to the tongue portion of the next member than are the remaining portions of the one member, and a series of bodies alternately formed of two materials having dissimilar thermoelectric properties, there being one of said bodies between and electrically and thermally connected to overlapping tongue portions of each pair of members of the two sets, each body being connected to an offset portion of one member and another portion of an adjacent member of the other set.

4. In a thermopile, first and second sets of metallic heat conducting members, said members each having an upright sheet-like fin providing an extended heat transfer surface, the fins of the members in each set being arranged in spaced, parallel and aligned relationship, the fins of one set of members being parallel to but laterally spaced from the fins of the other set of members, the members of each set having tongues projecting from their fins toward and interdigitating with the tongues of the other set of members, at least the overlapping portions of the tongues of both sets of members being bifurcated to provide two junction portions on each tongue, one of the junction portions of each of said tongues being offset from the other junction portion of the tongue whereby said offset junction portion is disposed closer to a junction portion of the next heat conducting member than is said other junction portion, and a series of bodies alternately formed of two materials having dissimilar thermoelectric properties, there being one of said bodies disposed between and electrically and thermally connected to adjacent junction portions of each pair of adjoining tongues of the two sets of members.

5. In a thermopile, first and second sets of metallic heat conducting members, said members each having an upright sheet-like fin providing an extended heat transfer surface, the fins of the members in each set being arranged in spaced, parallel and aligned relationship, the fins of one set of members being parallel to but laterally spaced from the fins of the other set of members, the members of each set having tongues projecting from their fins toward and interdigitating with the tongues of the other set of members, at least the overlapping portions of said tongues of both sets of members being twisted from and disposed obliquely with respect to the planes of the remaining portions of the members, the oblique portions of the members of both sets being substantially parallel to one another, and a series of bodies formed of two materials having dissimilar thermoelectric properties, there being one of said bodies disposed between and electrically and thermally connected to adjacent oblique portions of each pair of tongues for the two sets of members.

References Cited in the file of this patent

UNITED STATES PATENTS

| | | |
|---|---|---|
| 704,596 | Thwing | July 15, 1902 |
| 715,265 | Heil | Dec. 9, 1902 |
| 1,677,029 | Fuller et al. | July 10, 1928 |
| 2,932,953 | Becket et al. | Apr. 19, 1960 |
| 2,944,404 | Fritts | July 12, 1960 |

FOREIGN PATENTS

| | | |
|---|---|---|
| 140,833 | Germany | Oct. 3, 1901 |
| 23,227 | Austria | Feb. 26, 1906 |